(12) United States Patent
Bergenek et al.

(10) Patent No.: US 10,422,485 B2
(45) Date of Patent: Sep. 24, 2019

(54) LUMINOUS MEANS HAVING LEDS ARRANGED ON FOLD-OUT SURFACES

(71) Applicant: LEDVANCE GMBH, Garching (DE)

(72) Inventors: Krister Bergenek, Regensburg (DE); Florian Bösl, Regensburg (DE); Andreas Dobner, Wenzenbach (DE); Tobias Schmidt, Augsburg (DE); Andreas Kloss, Neubiberg (DE); Frank Vollkommer, Gauting (DE)

(73) Assignee: LEDVANCE GMBH, Garching (DE)

( * ) Notice: Subject to any disclaimer, the term of this patent is extended or adjusted under 35 U.S.C. 154(b) by 0 days.

(21) Appl. No.: 15/566,168

(22) PCT Filed: Mar. 2, 2016

(86) PCT No.: PCT/EP2016/054357
§ 371 (c)(1),
(2) Date: Oct. 12, 2017

(87) PCT Pub. No.: WO2016/165871
PCT Pub. Date: Oct. 20, 2016

(65) Prior Publication Data
US 2018/0087724 A1    Mar. 29, 2018

(30) Foreign Application Priority Data

Apr. 15, 2015   (DE) .......................... 10 2015 206 805

(51) Int. Cl.
*F21K 9/237*        (2016.01)
*F21K 9/90*         (2016.01)
(Continued)

(52) U.S. Cl.
CPC ............. *F21K 9/237* (2016.08); *F21K 9/232* (2016.08); *F21K 9/235* (2016.08); *F21K 9/238* (2016.08);
(Continued)

(58) Field of Classification Search
CPC .......... F21K 9/232; F21K 9/233; F21K 9/238; F21Y 2115/10; F21Y 2107/00;
(Continued)

(56) References Cited

U.S. PATENT DOCUMENTS

| 2010/0124060 A1 | 5/2010 | Wang |
| 2010/0157595 A1* | 6/2010 | Lin ........................... F21K 9/00 362/235 |

(Continued)

FOREIGN PATENT DOCUMENTS

| DE | 103 51 462 A1 | 6/2005 |
| DE | 10 2012 218 181 A1 | 4/2014 |
| JP | 2012/018865 A | 1/2012 |

OTHER PUBLICATIONS

International Search Report and English language translation dated Apr. 14, 2016, in International Application No. PCT/EP2016/054357 (6 pages).

(Continued)

Primary Examiner — Alexander K Garlen
(74) Attorney, Agent, or Firm — Hayes Soloway PC

(57) ABSTRACT

A luminous means is disclosed, the luminous means having LEDs on a substrate, an outer bulb in which the substrate having the LEDs is arranged, and a cap, wherein at least two partial surfaces of the substrate are folded out with respect to the remaining substrate around a bridge area in each case, via which the particular partial surface is connected to the remaining substrate, and are thus set obliquely with respect to the remaining substrate which is flat per se, wherein, for each side surface of the remaining substrate, which side surfaces are opposite one another with respect to a thickness direction of the remaining substrate, at least one partial surface is folded out in each case, and wherein at least one of the LEDs is arranged on each of the partial surfaces.

22 Claims, 5 Drawing Sheets

(51) Int. Cl.
- *F21V 7/00* (2006.01)
- *H05K 1/18* (2006.01)
- *F21V 29/85* (2015.01)
- *F21K 9/232* (2016.01)
- *H05K 1/02* (2006.01)
- *F21V 29/70* (2015.01)
- *F21V 29/89* (2015.01)
- *F21K 9/238* (2016.01)
- *F21K 9/68* (2016.01)
- *F21K 9/235* (2016.01)
- *F21V 3/06* (2018.01)
- *F21V 3/02* (2006.01)
- *F21V 19/00* (2006.01)
- *F21K 9/00* (2016.01)
- *F21Y 115/10* (2016.01)
- *F21Y 107/50* (2016.01)
- *H05K 3/22* (2006.01)

(52) U.S. Cl.
CPC ............ *F21K 9/68* (2016.08); *F21K 9/90* (2013.01); *F21V 3/02* (2013.01); *F21V 3/0615* (2018.02); *F21V 7/0008* (2013.01); *F21V 7/0016* (2013.01); *F21V 19/0025* (2013.01); *F21V 29/70* (2015.01); *F21V 29/85* (2015.01); *F21V 29/89* (2015.01); *H05K 1/028* (2013.01); *H05K 1/189* (2013.01); *F21K 9/00* (2013.01); *F21Y 2107/50* (2016.08); *F21Y 2115/10* (2016.08); *H05K 1/0203* (2013.01); *H05K 1/0274* (2013.01); *H05K 3/22* (2013.01); *H05K 2201/0145* (2013.01); *H05K 2201/066* (2013.01); *H05K 2201/09081* (2013.01); *H05K 2201/10106* (2013.01); *H05K 2201/2054* (2013.01); *H05K 2203/0228* (2013.01); *H05K 2203/107* (2013.01); *H05K 2203/302* (2013.01)

(58) Field of Classification Search
CPC .......... F21Y 2107/50; H05K 2201/046; H05K 2201/09081; H05K 1/189
See application file for complete search history.

(56) References Cited

U.S. PATENT DOCUMENTS

| | | | |
|---|---|---|---|
| 2011/0242816 A1* | 10/2011 | Chowdhury | F21V 29/63 362/294 |
| 2012/0250323 A1 | 10/2012 | Velu | |
| 2013/0039063 A1* | 2/2013 | Quaal | F21V 31/04 362/235 |
| 2013/0058090 A1* | 3/2013 | Ferrie | F21V 3/04 362/249.02 |
| 2013/0182440 A1* | 7/2013 | Ferrie | F21V 21/005 362/249.08 |
| 2014/0153261 A1 | 6/2014 | Marinus et al. | |
| 2014/0239794 A1 | 8/2014 | Hussell et al. | |
| 2015/0015142 A1* | 1/2015 | Chu | F21K 9/90 315/51 |
| 2015/0369457 A1* | 12/2015 | Chang | H05K 1/189 362/311.14 |

OTHER PUBLICATIONS

Search Report issued in German priority application DE 10 2015 206 805.6 (7 pages).

* cited by examiner

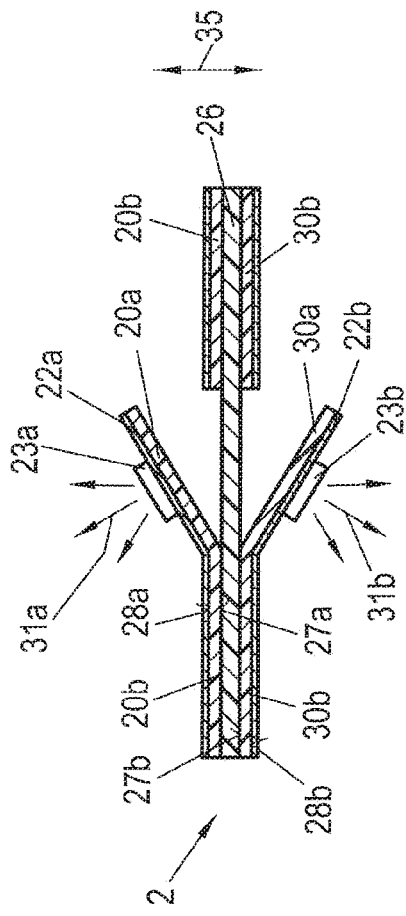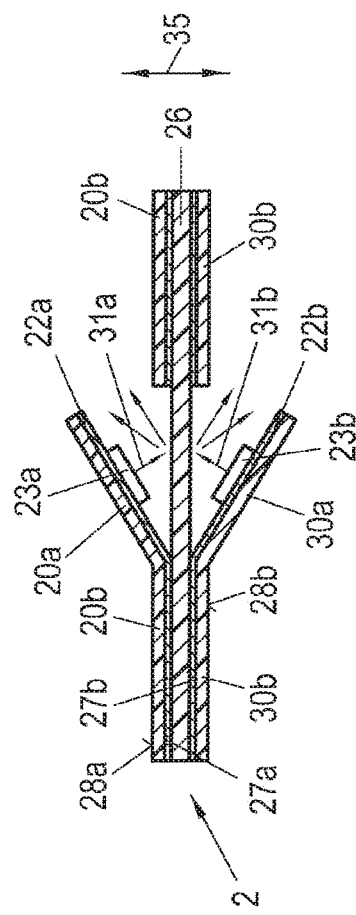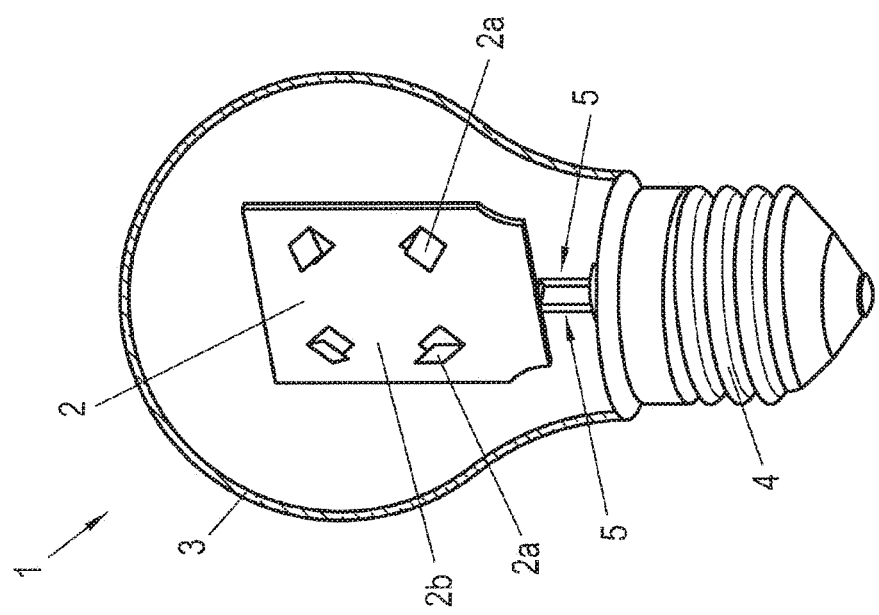

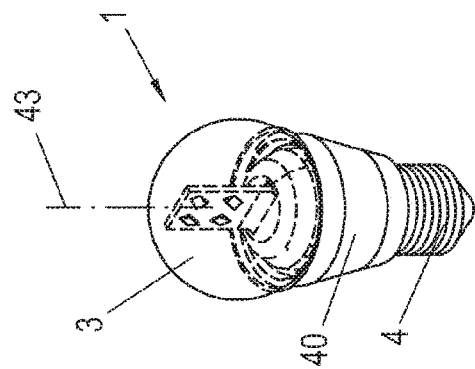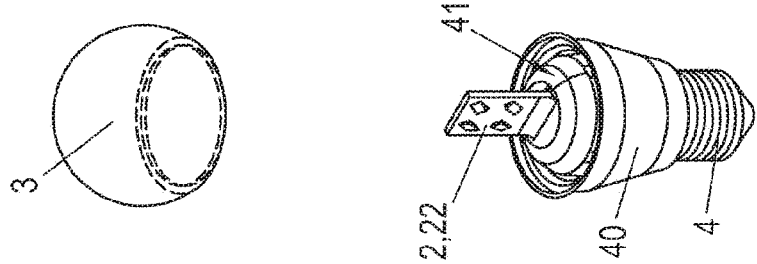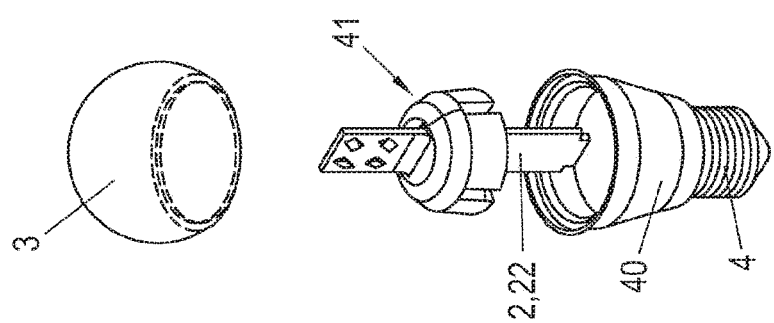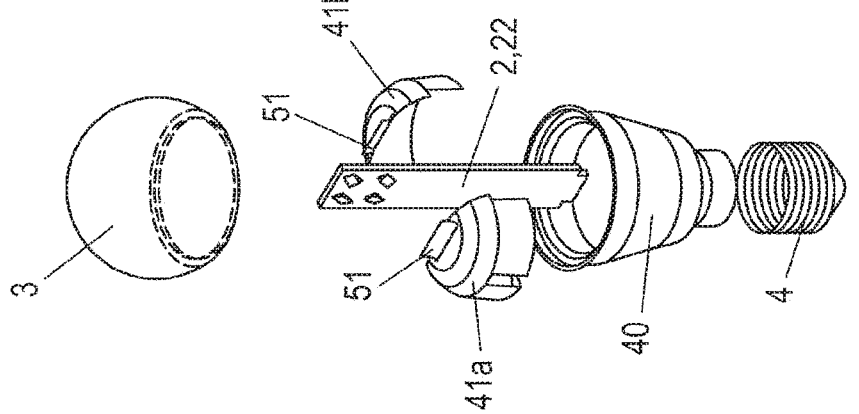

LUMINOUS MEANS HAVING LEDS ARRANGED ON FOLD-OUT SURFACES

CROSS REFERENCE TO RELATED APPLICATIONS

This application is the U.S. national phase entry under 35 U.S.C § 371 of International Application No. PCT/EP2016/054357, filed on Mar. 2, 2016, which claims priority to German Patent Application No. 10 2015 206 805.6, filed on Apr. 15, 2015, the entireties of which are incorporated by reference herein.

TECHNICAL FIELD

The present invention relates to a luminous means having LEDs mounted on a substrate, wherein the substrate having the LEDs is arranged in an outer bulb.

PRIOR ART

A conventional luminous means such as, for example, a filament bulb emits light with approximately unidirectional light distribution, thus, in simple terms, the same amount of light is emitted in all directions (except for shading by the base of the filament bulb, for example). An LED, on the other hand, emits light directionally, namely generally with Lambertian light distribution. The light intensity, or radiant intensity, is thus maximum, for example, along a surface normal to a radiating surface of the LED and decreases as the angle relative to the surface normal increases, no light reaches the rear space.

In order ultimately to generate homogeneous light distribution despite this directional light emission for each LED, there are known from the prior art, for example, luminous means in which the light emitted by an LED is redistributed by a lens, for example by a combination of light refraction and reflection (usually total reflection). In this manner it is possible to generate from the Lambertian light distribution of the LED, for example, a light distribution in which the light, similarly to a filament bulb, fills a light volume which is greater than a half-space. Light is thus redistributed by the lens into the rear space.

PRESENTATION OF THE INVENTION

The technical problem underlying the present invention is to provide a luminous means that is advantageous over the prior art, and a method for the production thereof.

This object is achieved according to the invention with a luminous means having a plurality of LEDs for emitting light, a substrate, a conductive track structure on the substrate, on which substrate the LEDs are mounted and thereby electrically conductively connected to the conductive track structure, an outer bulb which is transmissive for the light emitted by the LEDs, in which the substrate having the LEDs is arranged, and a base with which the LEDs are electrically operably connected via the conductive track structure, wherein at least two part surfaces of the substrate are folded out relative to the remainder of the substrate in each case about a bridge region via which the respective part surface is connected to the remainder of the substrate, folded-out and are thus inclined relative to the remainder of the substrate, which is flat, wherein for each side surface of the remainder of the substrate, which side surfaces are mutually opposite in relation to a thickness direction of the remainder of the substrate, in each case at least one part surface is folded out, and wherein at least one of the LEDs is arranged on each of the side surfaces;

and a method with the steps:
providing the substrate;
folding out the part surfaces from the remainder of the substrate.

Preferred embodiments will be found in the dependent claims and in the disclosure as a whole, a specific distinction not always being made in the presentation between device aspects and method or use aspects; in any case, the disclosure is implicitly to be read in respect of all claim categories.

A basic idea of the invention consists in providing a substrate which is in principle flat and thus thin but nevertheless achieving directional adjustability of the emission of light that is dissociated from the surface by folding out the part surfaces. The emission of light in different directions is thereby achieved by the arrangement of the LEDs on the inclined part surfaces, so that the various LEDs thus already originally emit light in different directions owing to their relative arrangement with respect to one another. The emission of light in different directions is to a certain extent already integrated into the substrate; for example, in comparison with the prior art mentioned at the beginning (luminous means having a lens), the number of individual parts to be fitted into the luminous means can thus be reduced, for example (a substrate as carrier for the LEDs is of course also required in the prior art). This can reduce the outlay in terms of assembly of the luminous means in particular in mass production and thus, for example, also help to reduce possible sources of error and thus the number of rejects, especially since the inventory holding can also be reduced.

Compared to an alternative approach considered by the inventors, namely the provision of a carrier that is already three-dimensional, for example a cuboid, in which LEDs would then have to be mounted on five of the six side surfaces, for example, the present approach, for example the equipping, can have advantages. As is explained in detail below, the LEDs can be mounted on the substrate (or layers thereof) as a flat body, namely if the part surfaces are preferably not folded out until after they have been equipped.

The folding out according to the invention of the part regions also advantageously allows the light distribution to be adapted easily from one product line to another, specifically via the folding-out angle. This is in any case also possible, within certain limits, with the luminous means otherwise unchanged, thus can be implemented with a moderate outlay. The flexibility is increased.

By folding out at least one part surface for each side surface of the remainder of the substrate, it is possible, for example, to provide for four quadrants in each case predominantly. In general, LEDs can also be arranged on the side surfaces of the remainder of the substrate and already provide for two mutually opposite directions, which are then supplemented by the directions provided by the LEDs of the part surfaces. However, a plurality of part surfaces are preferably folded out for each side surface, that is to say at least two, preferably at least three, particularly preferably four, part surfaces each equipped with at least one LED. Preferred upper limits may be, for example, at most eight part surfaces, preferably at most six and particularly preferably at most five part surfaces (each equipped with at least one LED).

The "remainder of the substrate" is the substrate apart from all the folded-out part surfaces, thus it does not include a part surface. However, this separation is only notional, because each part surface is connected to the remainder of the substrate via the respective bridge region. The remainder of the substrate is "flat", thus has a considerably greater, for example at least 10, 15 or 20 times (with increasing preference in the order given) greater, extent in each of its surface directions than in the thickness direction perpendicular thereto; where the thickness varies over the substrate, an average formed over the substrate is considered, preferably the thickness is constant. The "side surfaces" are mutually opposite in relation to the thickness direction, thus they extend in each case in the surface directions.

The LEDs "mounted" on the substrate are preferably soldered, at least some of the soldered connections at the same time establishing the electrical contact between the conductive track structure and the LED and serving to mechanically fix the LED (however, soldered connections that serve only for mechanical fixing/thermal connection can additionally be provided). Preferably LEDs are as so-called SMD (surface mounted device) components, which are soldered in a reflow process. The luminous means can be electrically connected (from outside in use) via the base.

The LEDs are "electrically operably" connected to the base, that is to say to the connecting points thereof that serve for contacting from outside, preferably with the interposition of a driver electronics (between the connecting points of the base and the LEDs). The luminous means is preferably configured for operation at mains voltage (at least 100 volts), thus mains voltage can be applied to the base connecting points and is preferably adapted for operation of the LEDs by means of a driver electronics of the luminous means.

The luminous means is preferably designed as a filament bulb replacement; the base is preferably an Edison base, particularly preferably with the thread identifier E27. In general, the outer bulb can also be clear (transparent), but it is preferably frosted, thus, for example (when the luminous means is not emitting light), the circuit board is visible through the outer bulb from outside at most as an outline, preferably not at all. The frosting can be achieved, for example, by scattering centers, in particular scattering particles, embedded in the material of the outer bulb, and/or by scattering centers arranged on the surface of the outer bulb, for example a surface roughening and/or surface coating. Preference is given to a coating on the inside, that is to say a coating on the inner wall surface facing the LEDs, which can provide protection against scratches, for example, in use.

The substrate having the LEDs is so arranged in the outer bulb that the majority of the light emitted by the LEDs passes through the outer bulb, that is to say passes from inside to outside and is usable in an application. "Majority" in this respect can mean, for example, at least 70%, preferably at least 80%, further preferably at least 90%; a possible upper limit may be, for example, at most 99.9%. The light emitted by the LEDs can be incident on the inside wall of the outer bulb directly and/or after prior reflection and then pass through the inside wall to the outside.

Returning to the substrate and the part surfaces again: The latter are folded out relative to the remainder of the substrate about the respective bridge region, thus about the bridge region as a kind of hinge. The three-dimensional arrangement created by bending out the part surfaces persists owing to plastic deformation of the substrate itself and/or of a part connected thereto (preferably the conductive track structure, see below). The part surfaces are preferably each folded out from the remainder of the substrate about a fold line, thus a fold line in each case marks the transition between the part surface and the remainder of the substrate (the fold line is preferably in a substrate layer which is discussed below).

In a preferred embodiment, at least two part surfaces are folded out for each side surface, wherein the part surfaces each being folded out by at least 25°, with increasing preference in this order at least 30°, 35°, 40° or 42.5°, relative to the remainder of the substrate. Advantageous upper limits are, with increasing preference in this order, at most 65°, 60°, 55°, 50° or 47.5°, whereby the upper and lower limits are generally also to be disclosed independently of one another. Where reference is made here and in the following to part surfaces or part regions, in each case at least one LED is always arranged thereon, whereby advantageous upper limits may be, for example (with increasing preference in the order given), at most 5, 4, 3 or 2 LEDs; particular preference is given to exactly one LED for each part surface/part region.

By folding out the part surfaces by a corresponding angle, a main propagation direction, for each part surface, of the light emitted by the respective part surface, that is to say by the LED(s) thereon, is tilted relative to the thickness direction of the remainder of the substrate by, with increasing preference in the order given, at least 25°, 30°, 35°, 40° or 42.5°; possible upper limits (independently thereof) are, for example, with increasing preference in the order given, at most 65°, 60°, 55°, 50° or 47.5°. The "main propagation direction" is in each case formed as the average of all the direction vectors along which light from the LED(s) of the particular part surface is emitted, wherein each direction vector being weighted in this averaging with the light intensity associated therewith (each direction in which a light source radiates can be described as a vector, with which a light intensity can be associated).

For each part surface, the thickness direction of the remainder of the substrate is initially taken directly at the bridge region of the respective part surface in the remainder of the substrate. In general, the remainder of the substrate is preferably planar, thus the thickness direction does not change over the remainder of the substrate. The side surfaces of the planar remainder of the substrate then each lie in a plane, which planes are spaced apart from one another by the thickness of the remainder of the substrate.

The angles given above as being preferred for the folded-out state of the part surfaces correspond in the case of the planar remainder of the substrate to the angle of intersection between one of the two planes each containing a side surface and a plane which contains the particular part surface under consideration, or at least the part thereof equipped with LED(s); the part surfaces are preferably also each planar.

Although further LEDs can in general also be provided on the substrate in addition to the LEDs arranged on the part surfaces, preferably all the LEDs of the luminous means are arranged on folded-out part surfaces. In general, the part surfaces can have a surface area of, for example, at least 10 mm$^2$, 30 mm$^2$ or 50 mm$^2$ and (independently thereof), for example, at most 1000 mm$^2$, 500 mm$^2$ or 150 mm$^2$ (in each case with increasing preference in the order given).

In a preferred embodiment, at least two part surfaces are folded out for each side surface, in each case by at least 70°, preferably at least 80°, particularly preferably at least 85°, and (independently thereof) by at most 110°, preferably at most 100°, particularly preferably at most 95°. A main propagation direction of the light emitted by the respective part surface, that is to say by the LED(s) thereon, can be tilted relative to the thickness direction of the remainder of the substrate by, for example, at least 70°, 80° or 85° and (independently thereof) by at most 110°, 100° or 95° (in each case with increasing preference in the order given).

It can be preferred that the main propagation direction of the LED(s) of a first of the part surfaces correspondingly folded out (substantially by 90°) is substantially parallel to an outer bulb longitudinal direction, which extends parallel to an outer bulb longitudinal axis and points from the base towards the outer bulb. The outer bulb longitudinal axis can be an axis with which the outer bulb is radially symmetrical, preferably rotationally symmetrical. "Substantially parallel" means, for example, tilted relative thereto by at most 10°, preferably at most 5°, an angle of 0° is particularly preferred.

For each part surface, a second and third part surface, for example, can then be so arranged that the respective main propagation direction of the LED(s) arranged thereon encloses an angle of at least 80°, preferably at least 85°, and (independently thereof) of at most 100°, preferably at most 95°, with the outer bulb longitudinal direction. The main propagation directions of the LEDs of the second and third part surface are preferably exactly opposite one another.

In a preferred embodiment, at least four part surfaces are folded out for each side surface of the remainder of the substrate, and the part surfaces of each side surface are radially symmetrical with one another, thus they can be transferred into one another by rotation. The axis of rotation is perpendicular to the preferably itself planar remainder of the substrate. Preferably, exactly four part surfaces are folded out for each side surface, and the radial symmetry is fourfold, thus the smallest angle of rotation is equal to 90°.

In a preferred embodiment, the substrate is composed of at least two, preferably exactly two, substrate layers which are each flat and are assembled to form a multilayer substrate. The part surfaces are then part regions folded out of the substrate layers, thus in which the respective substrate layer is folded out relative to the remainder of the substrate layer. Where "part region(s)" and "remainder of the substrate layer" are mentioned, this refers in each case to the same substrate layer, thus "the remainder of" does not mean the other substrate layer but the particular substrate layer in question without part regions.

For each substrate layer, the part surface(s), the bridge region(s) and the remainder of the substrate layer are made from the same material throughout. The substrate layers are each monolithic, thus free in their interior of material boundaries between different materials or materials of different manufacturing origins, apart from any randomly distributed inclusions therein, for example reflective particles. The substrate layers are preferably each made from a plastics material, preferably from a polyester material, particularly preferably from polyethylene terephthalate (PET).

The "itself flat" substrate layers have a significantly greater extent in each of their surface directions than in the thickness direction perpendicular thereto, for example at least 20, 30 or 40 times greater. The substrate layers preferably extend parallel to one another in the multilayer substrate, disregarding the part regions in each case. The substrate layers are so arranged that their thicknesses (in the remainder of the substrate) add up. In a "part region", the respective substrate layer is folded out completely in terms of its thickness extent.

In a preferred embodiment, the substrate layers are connected together via a material-based joint connecting layer, particularly preferably an adhesive layer. For example, an adhesive film can be applied to one of the substrate layers, and the substrate layers can then be adhesively bonded to one another directly; preferably, however, another carrier/reflector (see below) is arranged between the substrate layers, and the substrate layers are each correspondingly connected thereto by a material-based connection, that is to say in each case with one of the mutually opposite side surfaces thereof.

In general, the assembled substrate layers do not necessarily have to be parts that are previously separate; for example, a substrate sheet can also be folded and laid back, in particular folded back, on itself about the fold line. However, the substrate layers are preferably parts that are previously separate.

In a preferred embodiment, for each substrate layer the at least one part region is folded out on an outer side surface of this substrate layer. "Outer side surface" here means, of the two side surfaces of the substrate layer that are mutually opposite in relation to the thickness direction, the side surface that at the same time is a side surface of the substrate, that is to say is situated outside and not on the inside of the assembled multilayer substrate. A part region is folded out "on a" respective outer side surface when is it folded into the half-space that the corresponding outer side surface faces.

The preferably exactly two substrate layers are then each situated wholly in a half-space, wherein these half-spaces adjoining one another in a plane which passes through the substrate perpendicularly to the thickness direction (lying centrally in the remainder of the substrate in relation to that thickness direction). Figuratively speaking, the substrate layers are thus not crossed over as a result of the folding out of the part regions. In general, it would therefore also be conceivable, for example, that the substrate layers are not arranged completely congruently and, for example, in each case a protruding edge/corner region is folded into the half-space of the other substrate layer. Preferably, the substrate layers extend congruently, thus the outside edges of the substrate layers coincide along the thickness direction of the remainder of the substrate, as seen from above.

In a preferred embodiment, for each substrate layer, the at least one part region is partially separated from the remainder of the substrate layer, that is to say apart from the bridge region, by a parting line; the parting lines pass through the respective substrate layer completely in the thickness direction. In their longitudinal extent, the parting lines each describe open (unclosed) curves, preferably they are each U-shaped. The parting lines each lie wholly within the respective substrate layer, thus they do not extend to the outer edge of the respective substrate layer (but are spaced apart therefrom in relation to their surface directions). In other words, the parting lines each extend, in relation to the surface directions, between two end points, and the two end points are each inside the respective substrate layer. Accordingly, for example, for each substrate layer, an edge region can remain free of part surfaces, which can increase the mechanical stability of the multilayer substrate or of the substrate layers prior to assembly. In general, the outer edge of a substrate layer is on the outside in relation to the surface directions thereof.

For these part regions, the details given above for the part surfaces are also preferred, for example as regards the number and also the arrangement. Preferably all the part surfaces or part regions for each side surface of the remainder of the substrate are formed by the same substrate layer.

Preferably, the remainder of the substrate layer represents a surface area of the respective substrate layer of at least 30%, with at least 40%, 50%, 60% or 70% being further lower limits, with increasing preference in the order given. On the other hand, the surface area of the remainder of the substrate layer should be, for example, at most 90%. Independently of the specific surface area, the remainder of the substrate layer for each substrate layer is preferably planar (thus its side surfaces each lie in one of two mutually parallel planes).

In a preferred embodiment, the substrate has a preferably flat carrier, preferably made of metal, which is arranged between the substrate layers (in relation to the thickness direction of the remainder of the substrate); the carrier is part of the multilayer substrate. The carrier has a higher bending stiffness than each of the substrate layers themselves, for example at least 2, 4, 6, 8 or 10 times higher. In principle, a rigid carrier can also be provided, although upper limits may be, for example, at most 1000 or 500 times the bending stiffness of the substrate layers themselves. The carrier is preferably made from metal, particularly preferably from aluminum, which, in addition to mechanical stabilization, can also help to improve the heat dissipation from the LEDs. In general, however, mechanical stabilization can also be achieved, for example, with a plastics carrier of corresponding stiffness.

Although a grid, for example, is generally also conceivable as the carrier, preference is given to a flat carrier which is continuous (uninterrupted) in relation to its surface directions, for example a plate. The thickness thereof perpendicularly to the surface directions, which is generally taken as an average and is preferably constant, can be, for example, at least 0.5 mm, preferably at least 1 mm, further preferably at least 1.5 mm, particularly preferably at least 2 mm, possible upper limits (independently thereof) being, for example, at most 5 mm, 4 mm or 3 mm (with increasing preference in the order given). The carrier is preferably "flat", thus has a considerably greater extent, for example at least 15, 20 or 25 times greater (with increasing preference in the order given), in each of its surface directions than in the thickness direction perpendicular thereto (where the thickness varies, an average is considered). The carrier should extend, for example, over at least 60%, 70%, 80% or 90% of the surface of the remainder of the substrate. The carrier is preferably a part that is planar overall.

The substrate layers and the carrier are integral with one another, that is to say cannot be separated from one another without damage (without damaging one of them or a layer between them). The carrier and the substrate layers are preferably put together as previously separate parts, wherein each of the substrate layers preferably being connected to the carrier by a material-based joint connection, preferably an adhesive bond, particularly preferably an extensive adhesive film. In a preferred multilayer substrate, the layer sequence is thus as follows: substrate layer, adhesive film, carrier, adhesive film, substrate layer. The substrate layers can also be assembled with the carrier in a belt or roller process (reel to reel), for example.

In a preferred embodiment, a flat reflector is provided between the substrate layers, with regard to the arrangement thereof "between" the substrate layers, the "flatness", the "integralness" with the substrate layers and the extent relative to the remainder of the substrate, reference is made explicitly to the above details regarding the carrier, which are also to be disclosed in relation to the reflector. Indirect light can be given off via the reflector, thus the light from the LEDs is not emitted immediately directly in the desired direction but first onto the reflector, see FIG. 2b for illustration. By means of the folded-out part regions, the LED main propagation directions can then each be oriented, for example, in such a manner that a directional component (which is parallel to the thickness direction of the remainder of the substrate) points to the remainder of the substrate.

After reflection, the main propagation direction of the light then has a directional component pointing away from the remainder of the substrate.

Preference is given to specular diffuse reflection, thus on the one hand a certain degree of scattering takes place which, for example, can make the preferably frosted outer bulb more attractive when viewed from outside because the LEDs at least appear less clearly as individual points of light. On the other hand, the reflection should also not be perfectly diffuse, so that the main propagation direction of the reflected light is thus not parallel to the thickness direction of the remainder of the substrate. A directional component parallel to the surface directions of the remainder of the substrate is thus retained in part, for example to the extent of approximately 30% and (independently thereof) at most 80%, in each case achieved by the inclined position of the part regions.

In the case of the part regions which are preferably each partially separated from the remainder of the substrate layer by a parting line, the remainder of each substrate layer is interrupted where the part regions are folded out. The reflector then in turn preferably extends without interruption beyond those interruptions. Thus, for each LED, at least some of the light is incident, through the respective interruption in the substrate layer formed by the folding out of the corresponding part region, on the reflector and is then emitted as indirect light.

In the embodiment having a reflector, it is generally preferred that, for each LED, at least 25%, preferably at least 40%, of the respective emitted light is incident on the reflector. The reflector has, for example, a degree of reflection of at least 80%, with increasing preference in this order at least 85%, 90%, 95%, 97% or 98%; as high a degree of reflection as possible may be preferred, for technical reasons an upper limit may be, for example, 99.9%. The degree of reflection is here in each case considered as an average over the visible range of the spectrum (380 nm to 780 nm). In general, the reflector can also be in the form of a multilayer system with, for example, two reflective layers; preferably, however, it is a monolithic part, see the relevant definition above.

In a preferred embodiment, the carrier and the reflector are the same part, which thus at the same time increases the mechanical stability and serves to guide the light indirectly. Fewer individual parts, for example, then have to be assembled.

In another preferred embodiment, in which the light is not guided indirectly via a reflector, the LEDs are each mounted on an outer side surface of the respective substrate layer. For each substrate layer, the outer side surface is in each case the side surface of the substrate layer, which (side surface) is at the same time the side surface of the multilayer substrate.

In a preferred embodiment, the substrate layers each have a thickness of at least 150 µm, preferably at least 200 µm, particularly preferably at least 250 µm. Advantageous upper limits may be, for example, at most 500 µm, preferably at most 450 µm, further preferably at most 400 µm, particularly preferably at most 350 µm, whereby the upper and lower limits can expressly also be of interest independently of one another. For example in the case of the preferred plastics material, for example PET, the inventors have noted that, in the mentioned range, on the one hand the substrate has good basic stability but on the other hand the part regions can also be folded out easily.

In a preferred embodiment, which can also be of interest independently of a concretization of the substrate layer thickness, the conductive tracks of the conductive track structure have a thickness of at least 20 µm, preferably at least 25 µm, further preferably at least 30 µm, particularly preferably at least 35 µm. Advantageous upper limits may be, for example, at most 100 µm, preferably at most 90 µm, further preferably at most 80 µm, particularly preferably at most 70 µm, whereby the upper and lower limit can again also be of interest independently of one another. Conductive tracks of corresponding thickness are preferably provided on each substrate layer as part of the conductive track structure.

The thickness of the substrate layers/conductive tracks is taken along the thickness direction(s) of the substrate layers, an average formed over the substrate layers being considered where the thickness over the substrate layer is uneven. A constant thickness is preferred in each case.

A copper material is preferred for the conductive track structure. The copper can be or have been applied by lamination, for example, so that a copper film, for example, is connected to the substrate by a material-based connection via an adhesive layer. Preference is given to copper deposited on the substrate in a currentless manner in a bath. In a first step, for example, part of the layer (seed layer) can first be deposited and structured or also deposited directly on a mask, and then in a second deposition step the seed layer is increased to form the conductive track structure. However, one-step deposition is also possible.

In a preferred embodiment, the light distribution of the luminous means is homogenized in such a manner that the light intensity measured on a circular path around the outer bulb longitudinal axis (at an elevation angle of 90°, that is to say perpendicular to the outer bulb longitudinal direction) exhibits at most a slight variation. Any light intensity value taken on this circular path should thus represent at least 30%, preferably at least 25%, of a maximum value of the light intensity taken on the circular path. Preferably, the light intensity also exhibits a correspondingly small variation at other (but always constant for each circular path) elevation angles.

Preferably, in all directions which enclose an angle of between 0° and a critical angle with the outer bulb longitudinal direction (see above), a light intensity other than zero is still measured, which preferably represents at least 10%, further preferably at least 20% or 30% of a maximum light intensity. The critical angle is, with increasing preference, greater than 90°, 100°, 110°, 120°, 130°, 140°, 150° or 160°; at angles greater than 170°, the light intensity can be zero.

In the following, the unit consisting of the substrate and the conductive track structure, thus in particular the unit consisting of the multilayer substrate and the conductive track structure, is referred to as a "circuit board" for the sake of simplicity. A first of the LEDs is arranged on one side surface thereof and a second of the LEDs is arranged on the opposite side surface, preferably a third of the LEDs is arranged together with the first LED on the same side surface and a fourth of the LEDs is arranged together with the second of the LEDs on the same side surface. The details regarding the width/length refer to a multilayer substrate which is planar overall.

In a preferred embodiment, a heat sink is provided in direct thermal contact with the circuit board, which heat sink either itself forms an outer surface of the luminous means or is provided in direct thermal contact with part of the luminous means, preferably a housing part (see below) separate from the base, which forms an outer surface of the luminous means. The thermal resistance $R_{th}$ of the heat sink is dependent, for example, on the thermal conductivity of the heat sink material and on the connection thereof, but should be at most 25 K/W, whereby at most 20 K/W, 15 K/W, 10 K/W or rather 5 K/W are further upper limits of increasing preference in the order given. A thermal contact resistance between the circuit board and the heat sink should preferably be small, that is to say, for example, should represent at most 50%, 40%, 30%, 20% or 10% of the thermal resistance $R_{th}$ of the heat sink; the same is true for any thermal contact resistance to the part forming the outer surface of the luminous means (provided the heat sink does not itself form the outer surface).

The material of the heat sink is preferably a metal, for example aluminum, but it is also possible to provide, for example, a thermally conductive plastics material, that is to say, for example, a plastics material with particles embedded therein to increase the thermal conductivity.

"In direct thermal contact" means with at most a material-based connecting layer therebetween, for example a solder layer, preferably directly in contact with one another. Preferably, the heat sink is in contact (to the outside, for heat dissipation) with a housing part arranged between the base and the outer bulb, wherein the housing part and the heat sink are further preferably held together by an interference fit (press fit), that is to say the heat sink is pressed into the housing part. If a heat sink is provided, the outer bulb can be made of a plastics material, which can have cost advantages. The outer bulb also does not have to provide, for example, a closed gas volume (containing thermally conductive gas), which can help to reduce the outlay.

Thus, although the outer bulb does not have to hermetically seal the volume containing the circuit board by itself and together with the base and/or a housing part, it can at least be closed off to such an extent that the penetration of dust can be prevented. The thermal concept thus makes it unnecessary to provide, for example, ventilation slots and the like, which could otherwise allow the ingress of dirt. The outer bulb itself is preferably free of slots (connecting the inner and outer volumes).

In a preferred embodiment, the circuit board and the heat sink are in direct contact with one another and they have a contact surface with one another whose surface area is at least as large as a surface area of the two side surfaces of the circuit board that is equipped with LEDs. The base areas of the LEDs arranged on the circuit board are thus added together, and the contact surface between the heat sink and the circuit board should correspond at least to that total area. The contact surface is preferably divided into a plurality of part surfaces (which are each formed, for example, by a tongue, see below), which are spaced apart from one another, the part surfaces then further preferably being distributed equally over the side surfaces of the circuit board. The "base area" of an LED is taken at a perpendicular projection of the LED into a plane perpendicular to the thickness direction of the circuit board.

The contact surface which the circuit board and the heat sink have with one another should preferably represent, for example, with increasing preference in this order, at least 4 mm², 8 mm², 12 mm², 16 mm² or 20 mm². Possible upper limits (independently of the lower limits) are, for example, at most 80 mm² or 60 mm².

In a preferred embodiment, the heat sink is in direct contact at the mutually opposite side surfaces of the circuit board with in each case a tongue, preferably with in each case two tongues, further preferably in each case exactly two tongues. The circuit board is held by a friction-based connection between the tongues, which each form a part surface of the contact surface; a certain force is thus required in order to move the circuit board along the outer bulb longitudinal axis, the circuit board can be prevented by a friction-based connection, for example, at least from slipping out under the action of gravity (in the case of an outer bulb longitudinal axis that is parallel to the direction of gravity).

For each tongue, the particular part surface of the contact surface can have a surface area of, for example, with increasing preference in this order, at least 2 mm², 3 mm², 4 mm², 5 mm², 6 mm², 7 mm², 8 mm² or 9 mm². Possible upper limits (independently of the lower limits) may be, for example, at most 20 mm² or 15 mm².

For each tongue, it is preferred that a pressing region of the tongue forming the contact surface is closer to the LEDs than a deformation region of the tongue, the resilient deformation of which at least determines the majority of the pressing force. The tongue thus extends with the pressing region towards the LEDs and accordingly away from the base in the luminous means. The respective part surface (of the contact surface) can thus be arranged as close as possible to the LED, which helps to improve heat dissipation. In general, it can be preferred that at least the first and second LED (preferably also the third and fourth LED) have a smallest distance from their respective associated part surface of the contact surface of at most, with increasing preference in this order, 15 mm, 10 mm or 5 mm. Possible lower limits may be, for example, at least 0.5 mm or 1 mm.

In the case of a tongue having a pressing region extending towards the LEDs, the pressing region can also be followed (going from the deformation region to the pressing region) by a reflection region which rises away from the circuit board and on which some of the light emitted by the respective LED is incident and is reflected with a directional component along the outer bulb longitudinal axis. The proportion of the light incident thereon and being reflected thereby can be, for example, at least 5% or 10% (and, for example, at most 30% or 20%).

In a preferred embodiment, the heat sink is assembled from at least two parts, preference being given to exactly two parts, wherein the heat sink parts together enclose the circuit board, namely in relation to a circular path around the outer bulb longitudinal axis. "Assembled" means, for example, at most connected together by a friction-based, interlocking and/or material-based connection. Preferably, the heat sink parts are assembled on the circuit board in such a manner that, with the assembly of the heat sink, the heat sink is also already in position on the circuit board (thus as well as also arranged in the luminous means on the circuit board). Preferably, the heat sink parts are locked together, thus they are then held together in an interlocking manner. After assembly, the heat sink is preferably inserted, preferably pressed, into the housing part (see above), thus the heat sink is oversized relative to the housing part in order to be held therein with an interference fit.

The outer bulb is then fitted to the housing part, preferably seated in the form of an itself monolithic part having a movement along the outer bulb longitudinal axis. Preferably, the outer bulb is thereby pushed into the housing part to a certain extent and locked therewith.

Apart from the assembly of the heat sink parts around the circuit board, such a production method can, however, also be preferred in the case of a one-piece/monolithic heat sink. Such a heat sink can then also be held in the housing part by an interference fit, for example. In particular in the case of the monolithic heat sink (but generally also in the case of an assembled heat sink), the circuit board and the heat sink can generally also be connected together by a material-based connection, for example by a soldered or preferably welded connection.

In a preferred form of the heat sink assembled from heat sink parts, the heat sink and the circuit board are connected together in an interlocking manner, whereby the interlocking connection is intended to block a relative movement of the circuit board and the heat sink parallel to the outer bulb longitudinal axis. For that purpose there is preferably provided in the circuit board a groove which extends between the mutually opposite side surfaces thereof, preferably at an edge surface of the circuit board extending parallel to the outer bulb longitudinal axis, the edge surface is set back in the groove relative to the remainder of the edge surface. The assembled heat sink then engages into the groove and in this respect holds the circuit board in position.

In a preferred embodiment, the outer bulb and the housing part arranged between the base and the outer bulb adjoin one another at a circumferential (around the outer bulb longitudinal axis) line and the heat sink shades this boundary line from the LEDs, which prevents a direct light input, thus light falls from the LEDs onto the line without reflection. This can be perceived as more aesthetically pleasing when the luminous means is viewed from outside. Of course, the outer bulb and the housing part can also adjoin one another circumferentially at a surface; the "boundary line", when looking at the luminous means from outside, is considered to be the transition, visible at the outer surface of the luminous means, between the housing part and the outer bulb.

A housing part arranged between the base and the outer bulb and assembled (see the above disclosure relating to this term) with both is generally preferred, wherein it being possible for the housing part, based on a total length of the luminous means taken along the outer bulb longitudinal axis (from the base end to the opposite outer bulb end), to extend over, for example, at least 10%, preferably at least 20%, of that total length; possible upper limits are, for example, at most 40% or 30%.

The luminous means can, however, generally also be designed without such a housing part, wherein the outer bulb and the base then being assembled directly, that is to say adjoining one another (as in a conventional filament bulb). The driver electronics can then be accommodated in the base, for example. In order to be able to recreate a filament bulb shape with an outer bulb tapering towards the base, the outer bulb is in this case preferably assembled from two half-shells, which further preferably adjoin one another in a plane containing the outer bulb longitudinal axis.

Independently of this configuration (with/without a housing part) and the outer bulb specifically, the driver electronics for supplying the LEDs is in a preferred embodiment arranged with the LEDs on the same circuit board. Preferably, the luminous means has only a single circuit board, which already has cost advantages and can also help to reduce the outlay in terms of mounting. Because the luminous means is provided with a heat sink, it is not necessary, for example, for cooling purposes to evacuate the outer bulb and fill it with thermally conductive gas, but the outer bulb can instead be filled with air. Housed electronic components (driver electronics) can then be arranged in the same air volume, which would be disadvantageous in the case of a thermally conductive gas, for example due to outgassing of the molding compound.

In another preferred embodiment, a glass outer bulb is provided, and this glass outer bulb delimits a closed volume. The closed volume is preferably filled with a filling gas which has a higher thermal conductivity compared to air (the gas mixture of the earth's atmosphere at sea level). The filling gas can contain helium, for example, namely in a greater proportion than air, for example in a proportion of, with increasing preference in this order, at least 50 vol. %, 70 vol. %, 99 vol. %. The helium in the filling gas can be mixed, for example, with air and/or nitrogen and/or oxygen.

In a preferred embodiment, the circuit board having the LEDs is then arranged wholly within the filling gas volume delimited by the glass outer bulb, thus it does not extend through the outer bulb wall. Further preferably, it is also spaced apart from an inner wall surface of the outer bulb delimiting the filling gas volume, thus it is not in contact therewith.

In a further form of the circuit board arranged wholly within the filling gas volume, the circuit board is free of a driver electronics, thus preferably only the LEDs are arranged on the circuit board and are electrically conductively connected to the conductive track structure. The driver electronics nevertheless preferably integrated into the luminous means is then arranged, for example, in the base, for example on a second circuit board. By not providing a driver electronics within the filling gas volume (the filling gas volume is free thereof), it is possible to prevent, for example, contamination of the filling gas, which could damage the LEDs, for example. When designing the driver electronics, it is then not necessary to give separate consideration to whether, for example, components of the housing technology (for example the potting compound) outgas; thus expensive special components do not have to be used, which can help to optimize costs in particular in respect of mass production.

In general, the circuit board preferably has a width, taken in one of the surface directions, of at most 30 mm, with at most 25 mm being further preferred and at most 20 mm being particularly preferred. Possible lower limits may be, for example, at least 15 mm or 18 mm. In a surface direction perpendicular to the above-mentioned surface direction, the circuit board preferably has a length of at most 60 mm, with at most 55 mm being further preferred and at most 50 mm being particularly preferred. In the luminous means, the circuit board is preferably so oriented that its width is taken perpendicularly to the outer bulb longitudinal axis. The longitudinal extent of the circuit board is then parallel to the outer bulb longitudinal axis.

The mentioned upper limits are to be understood as meaning that the circuit board, in particular in the case of the width, has a width over its entire length that is smaller than/equal to the upper limit. This preferably applies analogously to the lower limit and/or correspondingly to the upper/lower limit of the length. Although as large a circuit board as possible may generally be preferred for thermal reasons, for example, it can be advantageous to limit the width of the circuit board because the luminous means can thus be produced using manufacturing steps of a conventional filament bulb.

It is possible, for example, comparably to the manufacture of filament bulbs, to provide a glass bulb which tapers to an opening—instead of a lamp base with a glow filament there is then used, for example, a lamp base with a circuit board. The circuit board, which is limited in width, can thereby be introduced through the opening of reduced diameter (reduced owing to the taper). From the production point of view, compatibility with existing process steps or intermediate products is thus achieved.

The preferably frosted outer bulb is preferably coated on the inside for frosting (see above), further preferably with a scratch-resistant coating. In relation to the handling of the finished luminous means by a user, although the frosting coating is already protected by being arranged on the inner surface of the outer bulb, the provision of a scratch-resistant coating can advantageously prevent the coating from being damaged during assembly of the luminous means.

In the production context, "glass bulb" in the present case refers to a preliminary stage of the outer bulb which is characterized by the opening on one side, to which the glass bulb tapers. By closing the opening of the glass bulb, the outer bulb delimiting a closed volume is produced, the tapering, that is to say pear-shaped, form preferably remaining unchanged.

The glass bulb opening does not necessarily have to be closed in a single step. Preferably, the circuit board is held in a lamp base made of glass, which is placed at the opening and fused with the glass bulb. The lamp base thereby closes the opening, but preferably not yet completely; instead, it still provides a channel through which the inner volume of the glass bulb is accessible to compressed fluid. The filling gas is introduced into the inner volume of the glass bulb via the channel, and then the channel is closed, preferably by fusion of glass. Before the filling gas is introduced, the inner volume of the glass bulb is preferably at least partially evacuated via the channel.

Current leads, for example of wire, which are electrically conductively connected to the circuit board, preferably already pass through the lamp base of glass when it is positioned at the opening of the glass bulb, via which current leads the LEDs are thus electrically operable/contactable. After the lamp base has been fixed in place, and preferably also after the glass bulb has been closed, the base is then electrically conductively connected to the current leads and fitted to the outer bulb, for example connected thereto by a material-based connection, for example adhesively bonded.

Returning to the multilayer substrate and the production thereof: In a preferred embodiment, the parting lines preferably provided in the substrate layers are introduced by means of a mechanical cutting tool or by laser cutting. Preferred as the mechanical cutting tool is a stamping tool, thus the parting lines are then stamped, which is also possible, for example, in a reel-to-reel process. In general, however, the parting lines could also be etched, for example; however, compared with etching, stamping can have advantages in terms of the throughput and thus in particular in mass production, while laser cutting permits high flexibility.

On the basis of these different examples it is also clear that the parting lines can also have a very different width depending on the manner in which they are produced. The width of a parting line is always taken perpendicularly to its longitudinal extent, in a respective surface direction of the respective substrate layer; where the width varies over the longitudinal extent, an average formed over the width is taken. The respective substrate layer is considered with the part regions as yet not folded out, thus in the case of the finished luminous means a situation as if the part regions were not yet folded out (or theoretically folded back in again).

For example in the case of a parting line introduced by means of a cutting tool, this parting line can also be arbitrarily small, thus the part region and the remainder of the substrate can even adjoin one another along the parting line. In the case of laser cutting, on the other hand, there is a certain minimum width, for example of 50 µm, 100 µm or 150 µm. However, a wider parting line can also be introduced with a cutting tool, for example by means of three parallel cuts specifying the width of the parting line by their distance from one another. In general, it is preferred that the width of the parting line is at most 500 µm, 400 µm, 300 µm or 200 µm.

In a preferred embodiment, the conductive track structure is locally plastically deformed when the part regions are folded out, thus the conductive track structure then at least partially stabilizes the folded-out position. The conductive track structure would thus have to be plastically deformed again in order to fold the part regions in again. In particular in connection with this stabilizing function, the above-mentioned thicknesses have been found to be advantageous. The "local" deformation takes place, for example, wherever a fold line in a substrate layer intersects with the conductive track structure.

It can also be preferred that, in reference to such stabilization of the part regions, wherever the respective fold line runs, there is provided in addition to the conductive track structure a stabilizing metallization which is not electrically conductively connected thereto but is preferably applied in the same process as the conductive track structure. Such a stabilizing metallization, which thus does not contribute towards guiding the current, can cover the fold lines over as large an area as possible, for example, and, as outlined above for the conductive track structure, deform plastically there when the part regions are folded out.

In a preferred embodiment, the LEDs are already mounted on the respective substrate layer when the part regions are folded out, thus the LEDs are first mounted and then the part regions are folded out. This can simplify mounting of the LEDs considerably. Preferably the LEDs are also already mounted on the respective substrate layer when the parting lines are introduced.

As discussed in detail above, a preferred luminous means has a carrier and/or reflector, preferably both as an integrated part. Assembly then takes place in a preferred embodiment in such a manner that the part regions are first folded out from the respective substrate layer and then the substrate layers and the carrier/reflector are assembled. When the carrier/reflector is assembled with the substrate layers, the part regions have thus already been folded out from the substrate layers.

BRIEF DESCRIPTION OF THE DRAWINGS

The invention will be explained in greater detail below by means of exemplary embodiments, wherein the individual features within the scope of the further independent claims can also be fundamental to the invention in a different combination and, as before, a specific distinction is not made between the different claim categories.

The drawings specifically show

FIG. 1 a luminous means according to the invention having a substrate with part surfaces folded out;

FIG. 3a, b various possibilities for arranging the LEDs on the folded-out part surfaces;

FIG. 5a-d various steps of the production of the luminous means according to FIG. 4;

PREFERRED EMBODIMENT OF THE INVENTION

Figure 2C:
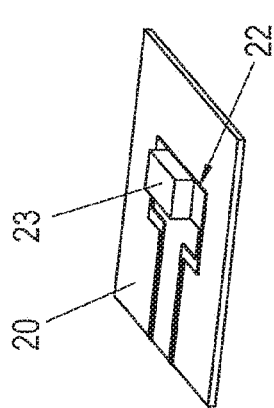
FIG. 2a-f various steps of the production of the substrate for the luminous means according to FIG. 1.
Figure 2F:
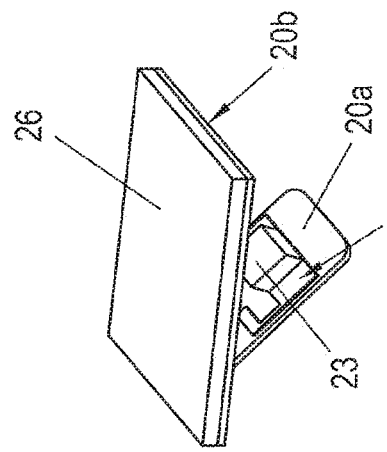
Figure 2B:
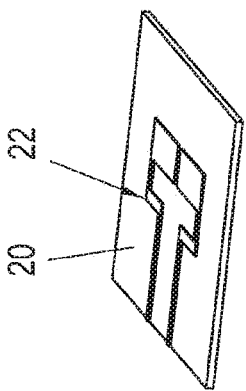
Figure 2E:
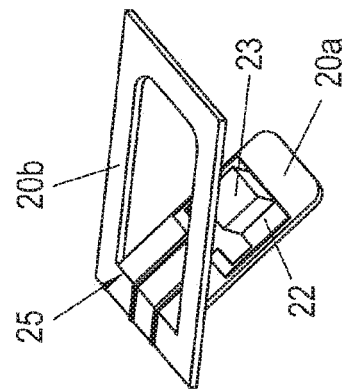
Figure 2A:
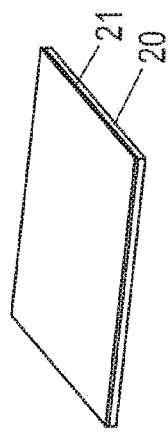

FIG. 1 shows a luminous means 1 according to the invention in a oblique view. LEDs (not shown here for the sake of clarity, see FIG. 2/3 in this respect) are mounted on a substrate 2, namely on part surfaces 2a which are folded out relative to the remainder of the substrate 2b and thus inclined thereto. The remainder of the substrate 2b is flat but, owing to the arrangement of the LEDs on the folded-out part surfaces 2a, adjustment of the light distribution dissociated from the surface is nevertheless possible.

The luminous means 1 is a replacement for a conventional filament bulb, the substrate 2 having the LEDs is arranged in an outer bulb 3, the outer bulb 3 shown cut away here is frosted. The outer bulb 3 is followed by a base 4 (E27 screw base), with which the LEDs are electrically operably connected via two connecting wires 5 and a driver electronics (not visible) arranged in the base 4.

The substrate 2 is a multilayer substrate which is composed of two substrate layers and a carrier/reflector arranged therebetween, see in this connection FIG. 3 in detail. In the following it will first be explained with reference to FIG. 2 how a part region which then forms a part surface 2a of the substrate 2 is folded out of such a substrate layer.

In a first step (FIG. 2a), there is applied to a substrate layer 20, namely a 300 μm thick plastics sheet of PET, a copper layer 21, namely in a currentless manner in a bath. A conductive track structure 22 is then produced from this copper layer 21 (FIG. 2b), for which purpose the copper layer 21 is masked with a photoresist. The photoresist is exposed and locally opened so that, in a subsequent etching process, the regions which then lie between the conductive tracks 22 are exposed. After etching there thus remains the conductive track structure 22 (and the photoresist is removed).

In a next step (FIG. 2c), an LED 23 is then mounted on the conductive track structure 22, namely as a so-called SMD (surface mounted device) component. The LED 23 thus has two rear contacts (not shown) facing the conductive track structure 22 and the substrate layer 20 beneath it, which contacts are connected to the conductive track structure 22 via in each case a material-based joint connecting layer, either via an electrically conductive adhesive (e.g. filled with silver) or a low-temperature solder.

Figure 2D:
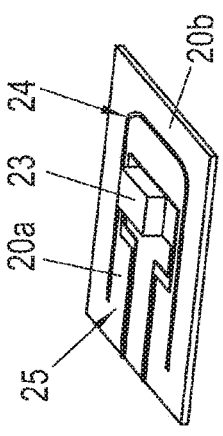

Next, for each part region 20a to be folded out, a parting line 24 partially separating the respective part region 20a from the remainder of the substrate layer 20b is structured, which parting line extends as an unclosed, U-shaped curve (FIG. 2d). However, each of the part regions 20a still remains connected to the remainder of the substrate layer 20b via a bridge region 25. The parting lines 24 are introduced either by laser cutting, which permits high flexibility, or by stamping, which can permit a good throughput.

The part regions 20a are then each folded out of the remainder of the substrate layer 20b about the bridge region 25 as a hinge, in each case by an angle of about 45°. A fold line which marks the transition between the part region 20a and the remainder of the substrate layer 20b thus extends in each case into the bridge regions 25.

In a final step, a reflector/carrier 26 is assembled with the substrate layer 20, for which purpose an inner side surface 27 of the substrate layer 20 is coated with an adhesive film in the region of the remainder of the substrate layer 20b, and substrate layer 20 and reflector 12 are then brought together. An outer side surface 28 of the substrate layer 20 opposite the inner side surface 27 can additionally be or have been provided with a reflective layer (not shown). However, the substrate layer 20 itself may also already be reflective owing to reflective particles embedded in the PET material. A further substrate layer 30 is then applied in the same manner to the opposite side of the carrier/reflector 26, see FIG. 3.

FIG. 3 shows the finished multilayer substrate 2 in a section. The LEDs 23 are mounted on the outside in the case of FIG. 3a; in FIG. 3b, on the other hand, they are mounted on the inside for indirect light emission. The structure according to FIG. 3b is obtained by means of the production steps explained with reference to FIG. 2; in order to produce the multilayer substrate 2 according to FIG. 3a, the part region 20a would have to be folded out on the other side of the substrate layer 20 and the carrier/reflector 26 arranged on the opposite side.

FIG. 3 shows the structure of the multilayer substrate 2, namely the carrier/reflector 26 with a substrate layer 20, 30 on each side thereof. In both variants according to FIG. 3a, b, the part regions 20a, 30a are each folded out on an outer side surface 28 of the respective substrate layer 20, 30. In FIG. 3a, the conductive tracks 22 and the LEDs 23 are then provided on that outer side surface 28; in the case of FIG. 3b, on the other hand, they are each provided on the inner side surface 27 of the respective substrate layer.

Accordingly, an LED main propagation direction 31 according to FIG. 3a points away from the substrate 2, whereas the LED main propagation direction 31 in FIG. 3b points towards the substrate 2. Some of the light emitted by the LEDs 23 is incident on the carrier/reflector 26 in FIG. 3b and is then given off as indirect light. By contrast, in the variant according to FIG. 3a the light is given off directly.

In both cases, an aluminum sheet is provided as the carrier/reflector 26. On each of the substrate layers 20, 30 there are provided conductive tracks 22, the thickness of which is about 50 μm. When the part regions 20a, 30a are folded out, the conductive tracks 22 are in each case locally plastically deformed, which stabilizes the part regions 20a, 30a in their folded-out position.

In the luminous means 1 according to FIG. 1, the production of which is explained in greater detail below, the outer bulb 3 is made from glass and filled with a thermally readily conductive filling gas (a helium mixture). In the following, the unit consisting of the multilayer substrate 2 and the conductive structure 22 is referred to as a "circuit board".

When the luminous means 1 is produced there is provided a glass bulb which already corresponds in shape to the outer bulb 3 but, unlike the outer bulb, is still open on the base side. The circuit board 2, 22 can be introduced through this opening.

When the circuit board 2, 22 is introduced into the glass bulb, the circuit board 2, 22 is already mounted on the lamp base. The wires 5, which are each electrically conductively connected to the circuit board 2, 22, pass through the lamp base of glass. As the circuit board 2, 22 is introduced into the glass bulb, the lamp base is positioned at the opening in the glass bulb in order to close the opening after fusion. However, the lamp base does not yet close the opening completely but provides a channel in its interior, through which the inner volume of the glass bulb is still accessible to compressed fluid; the inner volume is then first evacuated and then filled with the filling gas via the channel. The channel is then closed, whereby the circuit board 2, 22 is held in a closed volume of the outer bulb 3.

The wires 5 protruding from the outer bulb 3 are then each electrically conductively connected to a driver electronics (not shown) arranged outside the outer bulb 3; the driver electronics is in turn electrically conductively connected to the base 4 and then also arranged therein. When a mains voltage is applied to the connecting points of the base 4, the driver electronics adapts it for operation of the LEDs 23. In a final step, the base 4 and the outer bulb 3 are assembled and, for example, fastened to one another by an adhesive bond.

Figure 4:
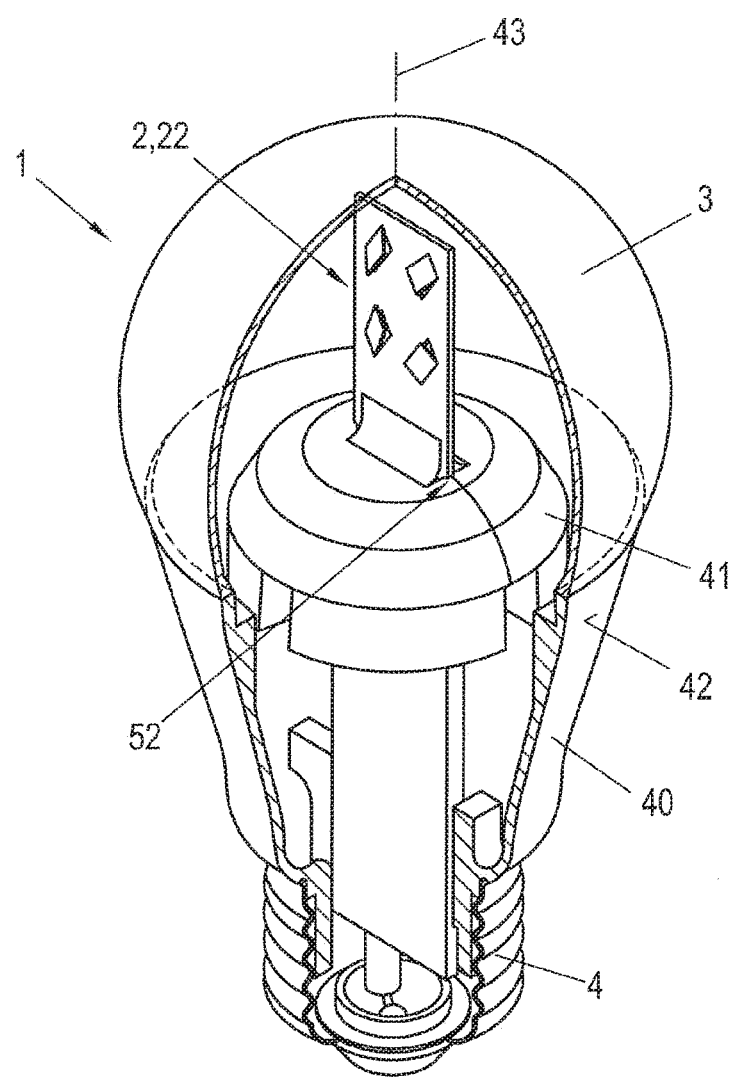
FIG. 4 a further luminous means according to the invention having a substrate with part surfaces folded out.

FIG. 4 shows an alternative luminous means 1 to that according to FIG. 1. In this case too, it is a replacement for a conventional filament bulb and the luminous means 1 is equipped with an E27 base 4. The circuit board 2, 22 is electrically conductively connected to the base 4 so that, when a voltage is applied to the base connecting points, a corresponding voltage is present at the circuit board 2, 22. On the circuit board 2, 22 there is provided a driver electronics (not shown), which adapts the voltage for operation of the LEDs 3.

The outer bulb 3 is in this case made from plastics material. In the present case it is shown clear, but in reality it is frosted. Between the outer bulb 3 and the base 4 there is arranged a housing part 40. An outer bulb longitudinal axis 43 extends through the luminous means 1 and passes through the base 4 and the outer bulb 3.

The luminous means 1 further has a heat sink 41 of aluminum, which serves to dissipate the heat generated by the LEDs 3. For that purpose, the heat sink 41 rests with four tongues flat against the circuit board 2, 22. The heat sink 41 rests against the housing part 40, which forms an outer surface 42 of the luminous means 1. The heat sink 41 has a thermal resistance $R_{th}$ of about 5 K/W.

FIG. 5 illustrates the assembly of the luminous means 1 in several steps. Initially, the outer bulb 3 and the circuit board 2, 22 are separate parts. Furthermore, the heat sink 41 is also made from two heat sink parts 41a, b which are initially separate (FIG. 5a). In a first step, the two heat sink parts 41a, b are fitted to the circuit board 2, 22, thus the heat sink 41 is assembled in its position on the circuit board 2, 22 (FIG. 5b).

With the assembly of the heat sink 41, tongues 51 provided on the heat sink are applied to the circuit board 2, 22. Furthermore, the circuit board 2, 22 is provided with a groove 52 (see FIG. 4 in detail), into which the heat sink 41 engages. The circuit board 2, 22 and the heat sink 41 are thus fixed in their relative position in relation to the outer bulb longitudinal axis 43.

The housing part 40 and the base 4 are initially also separate parts, which are assembled (FIG. 5b). In a next step, the unit consisting of the circuit board 2, 22 with the heat sink 41 is pressed into the housing part 40 (along the outer bulb longitudinal axis 43) and is then held therein by an interference fit (FIG. 5c).

In a final step (FIG. 5d), the outer bulb 3 is fitted, namely inserted to a certain extent into the housing part 40, with a movement along the outer bulb longitudinal axis 43. The outer bulb 3 is then held in an interlocking manner in the housing part 40.

Figure 6:
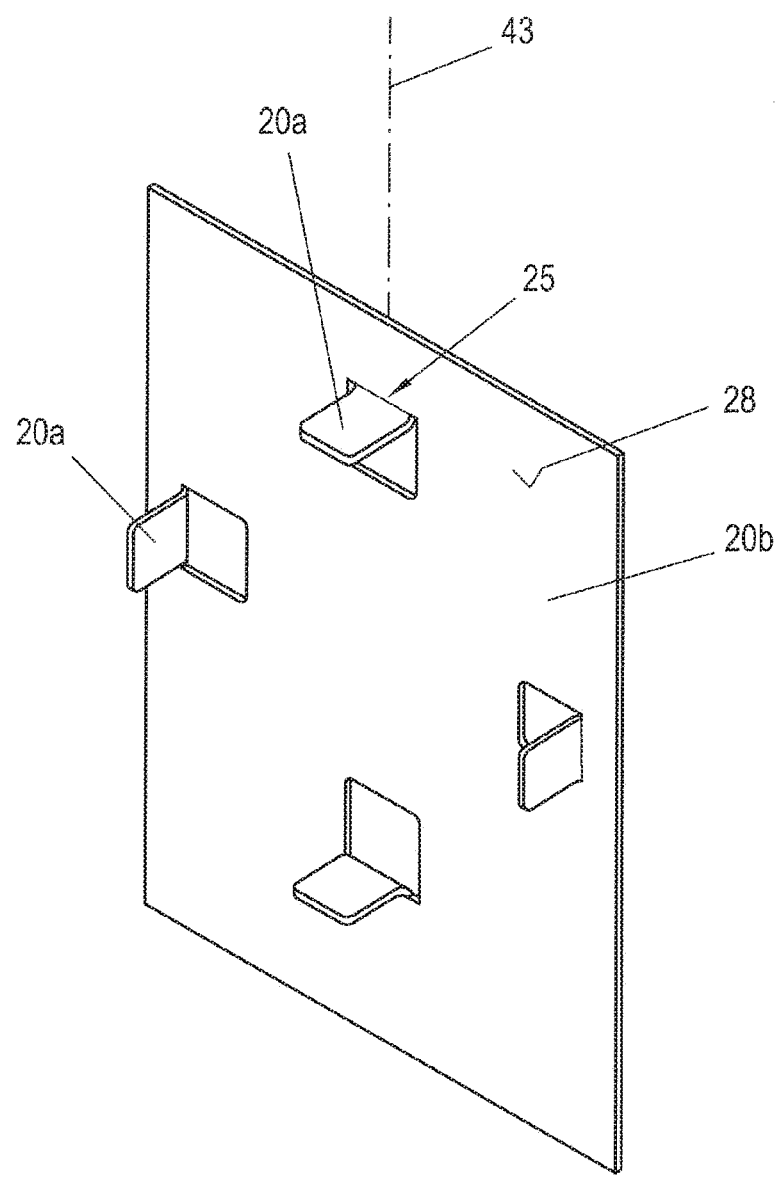
FIG. 6 a substrate layer for a substrate having an alternative arrangement of the LEDs to that of FIGS. 1 and 4.

FIG. 6 shows a substrate layer 20 with part regions 20a folded out relative to the remainder of the substrate layer 20b. Unlike the embodiments discussed hitherto, the part regions 20a (and thus the part surfaces of the correspondingly produced substrate) are in this case each folded out by 90°. The LEDs and the conductive tracks are arranged on the outer side surface 28, which is visible in FIG. 6, but are not shown for the sake of clarity. Apart from the different angle, the structure corresponds to that according to the above FIG. 3a, and reference is made to the corresponding description.

In the luminous means 1, the part regions 20a are then so arranged that the LED main propagation direction of the LED arranged on the upper part region 20a is parallel to an outer bulb longitudinal direction (which is parallel to the outer bulb longitudinal axis 43 and points away from the base 4 towards the outer bulb 3). The LED main propagation direction of the LED arranged on the lower part region 20a is opposed to the outer bulb longitudinal direction, the two LED main propagation directions of the LEDs on the remaining part regions 20a each enclose an angle of 90° with the outer bulb longitudinal direction.

The invention claimed is:

1. A luminous means comprising:
   a plurality of LEDs for emitting light;
   a substrate;
   a conductive track structure on the substrate, on which substrate the LEDs are mounted and thereby electrically conductively connected with the conductive track structure;
   an outer bulb which is transmissive for the light emitted by the LEDs, in which the substrate having the LEDs is arranged; and
   an electrically conductive lamp base with which the LEDs are electrically operably connected via the conductive track structure, wherein the electrically conductive lamp base is configured to be received by a power socket external to the luminous means;
   wherein at least two part surfaces of the substrate are each folded out relative to a remainder of the substrate about a respective bridge region via which the respective part surface is connected to the remainder of the substrate, folded-out and thus inclined relative to the remainder of the substrate, which is flat;
   wherein, for each side surface of the remainder of the substrate, which side surfaces are mutually opposite in relation to a thickness direction of the remainder of the substrate, in each case at least one part surface is folded out; and
   wherein at least one of the LEDs is arranged on each of the part surfaces.

2. The luminous means according to claim 1, in which, for each side surface of the remainder of the substrate, at least two part surfaces are folded out, on each of which at least one of the LEDs is mounted, wherein the part surfaces are each folded out by at least 25° and at most 65° relative to the remainder of the substrate.

3. The luminous means according to claim 1, in which, for each side surface of the remainder of the substrate, at least two part surfaces are folded out, on each of which at least one of the LEDs is mounted, wherein the part surfaces are each folded out by at least 70° and at most 110° relative to the remainder of the substrate.

4. The luminous means according to claim 2, in which, for each side surface of the remainder of the substrate, at least four part surfaces are folded out, which at least four part surfaces for each side surface of the remainder of the substrate are radially symmetrical with one another about a common axis of rotation.

5. The luminous means according to claim 1, in which the substrate is composed of at least two substrate layers which are each flat and are assembled to form a multilayer substrate, wherein the part surfaces are each a part region of one of the substrate layers, which part regions are folded out relative to the respective remainder of the substrate layer about the bridge region, wherein at least one part region is folded out from each substrate layer.

6. The luminous means according to claim 5, in which the substrate has a joint connecting layer with which the substrate layers are connected together by a material-based connection.

7. The luminous means according to claim 5, in which, for each substrate layer, the at least one part region is in each case folded out to an outer side surface of the respective substrate layer, which outer side surfaces are each at the same time a side surface of the substrate.

8. The luminous means according to claim 5, in which, for each substrate layer, the at least one part region is partially separated from the remainder of the substrate layer by a respective parting line which passes through the respective substrate layer in the thickness direction thereof and extends wholly within the respective substrate layer in relation to the surface directions thereof.

9. The luminous means according to claim 5, in which the substrate has a carrier which is arranged at least in some regions between the substrate layers, wherein the carrier has a higher bending stiffness than the substrate layers in each case separately.

10. The luminous means according to claim 5, in which the substrate has a flat reflector which is arranged between the substrate layers, wherein the LEDs arranged on the folded-out part regions are each arranged on an inner side surface of the respective substrate layer facing the reflector, so that, for each LED, at least a part of the light is incident on the reflector.

11. The luminous means according to claim 10, in which the substrate has a carrier which is arranged at least in some regions between the substrate layers, wherein the carrier has a higher bending stiffness than the substrate layers in each case separately, and in which the carrier is at the same time the reflector.

12. The luminous means according to claim 5, in which the LEDs are each mounted on an outer side surface of the respective substrate layer, which outer side surfaces are each at the same time a side surface of the substrate.

13. The luminous means according to claim 5, in which the substrate layers each have a thickness of at least 150 μm and at most 500 μm, and respective conductive tracks are provided on each of the substrate layers as part of the conductive track structure, which conductive tracks each have a thickness of at least 20 μm and at most 100 μm.

14. The luminous means according to claim 1, in which a light distribution generated with the luminous means is homogenized in that light intensity values taken on a circular path around an outer bulb longitudinal axis at an angle of 90° to an outer bulb longitudinal direction in each case represent at least 30% of a maximum value of the light intensity taken on the circular path.

15. The luminous means according to claim 1, having a heat sink which is provided in direct thermal contact with the substrate and forms an outer surface of the luminous means or is provided in direct thermal contact with a part forming an outer surface of the luminous means, wherein the heat sink has a thermal resistance ($R_{th}$) of at most 25 K/W.

16. The luminous means according to claim 15, in which the heat sink is assembled from at least two parts, which heat sink parts together enclose the substrate.

17. The luminous means according to claim 1, in which the outer bulb is made from glass and delimits a closed volume filled with a filling gas, which filling gas has a higher thermal conductivity than air.

18. The luminous means according to claim 17, in which the substrate having the conductive track structure is arranged wholly within the filling gas volume and is preferably free from driver electronics.

19. A method for producing a luminous means according to claim 1, the method comprising:
   providing the substrate; and
   folding out the part surfaces from the remainder of the substrate.

20. A method for producing a luminous means according to claim 8, wherein the parting lines are introduced by means of at least one of a mechanical cutting tool, a stamping tool, and laser cutting.

21. The method according to claim 19, in which the conductive track structure is locally plastically deformed when the part regions are folded out.

22. A method for producing a luminous means according to claim 5, wherein the part regions are already each folded out of the remainder of the substrate layer when the substrate layers are assembled.

* * * * *